United States Patent
Shepherd

(10) Patent No.: US 9,063,827 B2
(45) Date of Patent: Jun. 23, 2015

(54) SYSTEMS AND METHODS FOR STORING AND RETRIEVING A DEFECT MAP IN A DRAM COMPONENT

(75) Inventor: Michael Shepherd, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 392 days.

(21) Appl. No.: 13/404,967

(22) Filed: Feb. 24, 2012

(65) Prior Publication Data

US 2013/0227342 A1    Aug. 29, 2013

(51) Int. Cl.
*G06F 11/00*    (2006.01)
*G11C 29/56*    (2006.01)
*G11B 20/18*    (2006.01)

(52) U.S. Cl.
CPC ............ *G06F 11/00* (2013.01); *G11B 20/1883* (2013.01); *G11C 29/56* (2013.01); *G11B 2020/1893* (2013.01)

(58) Field of Classification Search
CPC ................ G06F 11/00; G11B 20/1883; G11B 2020/1893; G11C 29/56
USPC .................................. 714/6.13, 25; 365/201
See application file for complete search history.

(56) References Cited

U.S. PATENT DOCUMENTS

| | | |
|---|---|---|
| 6,192,486 B1 | 2/2001 | Correale, Jr. et al. |
| 7,694,195 B2 | 4/2010 | Khatri et al. |
| 7,783,919 B2 | 8/2010 | Khatri et al. |
| 2007/0030020 A1* | 2/2007 | Kinsley .......................... 324/760 |
| 2009/0070630 A1* | 3/2009 | Khatri et al. ..................... 714/37 |
| 2012/0151287 A1* | 6/2012 | Le et al. .......................... 714/718 |
| 2012/0182776 A1* | 7/2012 | Best et al. ........................ 365/51 |

OTHER PUBLICATIONS

Dictionary definition for DRAM, retrieved from "http://en.wikipedia.org/wiki/Dynamic_random-access_memory" on Oct. 17, 2014.*
Dictionary definition for memory cell, retrieved from "http://en.wikipedia.org/wiki/Memory_cell_(binary)" on Oct. 17, 2014.*

* cited by examiner

*Primary Examiner* — Yair Leibovich
(74) *Attorney, Agent, or Firm* — Baker Botts L.L.P.

(57) ABSTRACT

In accordance with the present disclosure, a dynamic random access memory (DRAM) component is described. The DRAM component may comprise an integrated circuit, with the integrated circuit including an array of volatile memory cells. A first volatile memory cells of the array of volatile memory cells may be defective. The integrated circuit may also include non-volatile memory, and the non-volatile memory may contain a reference to the first volatile memory cell.

20 Claims, 5 Drawing Sheets

SYSTEMS AND METHODS FOR STORING AND RETRIEVING A DEFECT MAP IN A DRAM COMPONENT

TECHNICAL FIELD

The present disclosure relates generally to the operation of computer systems and information handling systems, and, more particularly, to a systems and methods for storing and retrieving a defect map in a dynamic random access memory (DRAM) component.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

Information handling systems may include numerous types and configurations of memory components. One example memory component is a DRAM component. DRAM typically includes many millions of memory elements, or cells, that store bits of data. Due to manufacturing defects, or deterioration from use, some of the cells may be defective and unable to accurately store data. Preventing data from being stored in faulty cells is important, particularly to maintain a zero defect tolerance for the DRAM element. Existing DRAM components may provide redundant rows and columns of cells corresponding to a particular area within the DRAM component, as well as complex circuitry within the DRAM element to correct for defective cells. Unfortunately, such an approach adds cost to and/or reduces the available memory size of DRAM elements. Additionally, when the number of defective cells within the particular area is greater than the number of redundant row or columns available to repair the corresponding area, the DRAM component may be scrapped, even though the majority of the DRAM component is functioning correctly. Moreover, as the capacity of DRAM elements grows so does the burden of providing a sufficient amount of redundant cells of the DRAM element.

SUMMARY

In accordance with the present disclosure, a dynamic random access memory (DRAM) component is described. The DRAM component may comprise an integrated circuit, with the integrated circuit including an array of volatile memory cells. A first volatile memory cells of the array of volatile memory cells may be defective. The integrated circuit may also include non-volatile memory, and the non-volatile memory may contain a reference to the first volatile memory cell.

The system and method disclosed herein is technically advantageous because it allows references to defective volatile memory cells within DRAM memory to be stored on die. Specifically, references to defective volatile memory cells may be identified and stored while the DRAM memory is still being manufactured. The references may be retrieved later and the defective volatile memory cells may be mapped out of usable memory space. This may reduce or eliminate the need for redundant cells within the DRAM memory, which may decrease the cost, and increase the amount of space within DRAM memory for additional storage cells. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Illustrative embodiments of the present disclosure are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

Figure 1:
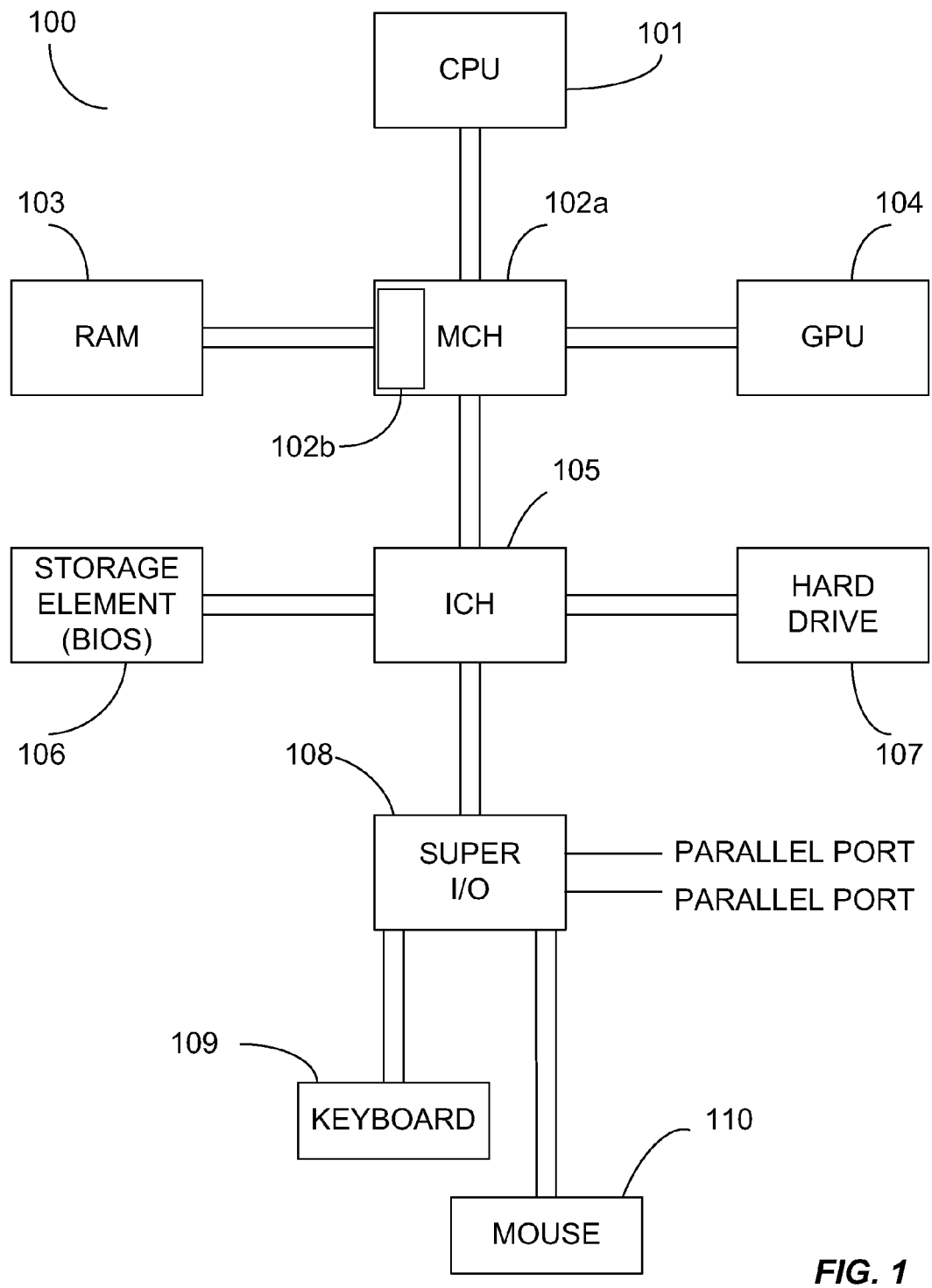
FIG. 1 shows an example information handling system.

Shown in FIG. 1 is a block diagram of a typical information handling system 100. A processor or CPU 101 of the typical information handling system 100 is communicatively coupled to a memory controller hub or north bridge 102. Memory controller hub 102a may include a memory controller 102b for directing information to or from various system memory components within the information handling system, such as RAM 103, storage element 106, and hard drive 107. The memory controller hub may be coupled to RAM 103 and a graphics processing unit 104. Memory controller hub 102a may also be coupled to an I/O controller hub or south bridge 105. I/O hub 105 is coupled to storage elements of the computer system, including a storage element 106, which may comprise a flash ROM that includes the BIOS of the computer system. I/O hub 105 is also coupled to the hard drive 107 of the computer system. I/O hub 105 may also be coupled to a Super I/O chip 108, which is itself coupled to several of the I/O ports of the computer system, including keyboard 109, mouse 110, and one or more parallel ports. The above description of an information handling system should not be seen to limit the applicability of the system and method described below, but is merely offered as an example computing system.

One example storage component for use in RAM 103, and in other storage devices, may be a DRAM component. A DRAM component may comprise arrays of volatile memory cells, each comprising a separate capacitor/transistor pair. In certain embodiments, the DRAM component may comprise an integrated circuit mounted on plastic packages with metal pins for connection to control signals and buses. The volatile memory cells may be included within the integrated circuit. The integrated circuit may also include, according to aspects of the present disclosure, non-volatile memory, which may store reference to defective volatile memory cells within the integrated circuit. A DRAM component may be incorporated into a DRAM memory module, including, but not limited to, a single in-line memory module (SIMM) and a dual in-line memory module (DIMM).

Figure 2:
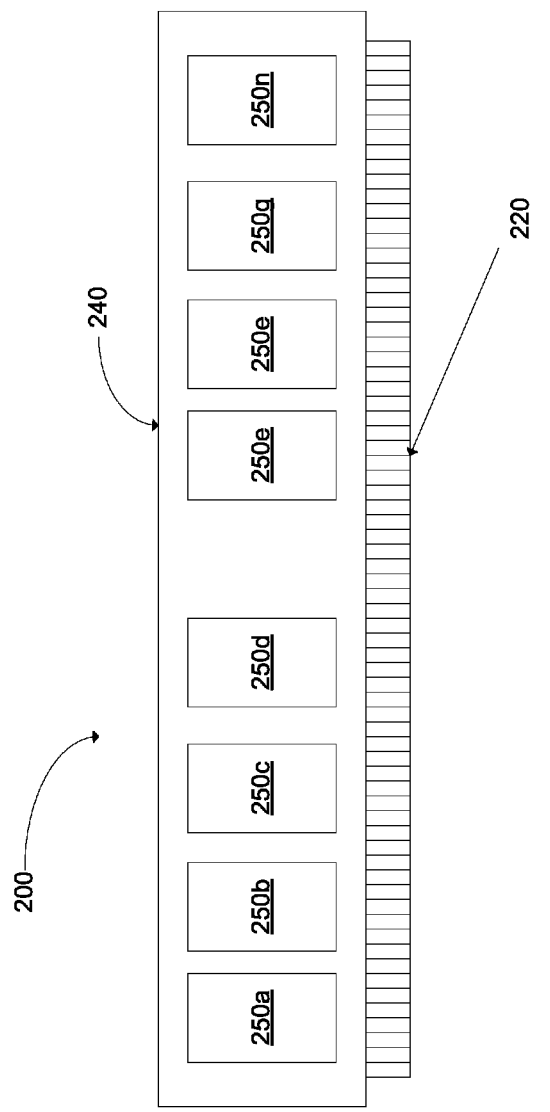
FIG. 2 shows an example memory module incorporating a DRAM component, according to aspects of the present disclosure.

FIG. 2 illustrates an example DRAM memory module, DIMM 200. The DIMM 200 may include a printed circuit board (PCB) 240 to which DRAM components 250a-n may be coupled. As mentioned above, the DRAM components 250a-n may comprise ICs incorporating DRAM memory cells, and may be coupled to the PCB 240 via pins incorporated within the IC packaging. The DIMM 200 may also include pins 220, through which the DIMM 200 communicates, for example, with a memory controller, such as memory controller 102b. The PCB 240 may include data pathways such as wires or busses through which the DRAM components 250a-n communicate with an information handling system coupled to the DIMM 200. In mobile device applications, such as mobile phone and tablets and ultrabooks, the DRAM components may be mounted directly to a motherboard rather than a module PCB, such as the DIMM 200 described above. This disclosure covers such embodiments, and is not limited to the module PCB embodiment illustrated in FIG. 2.

Figure 3:
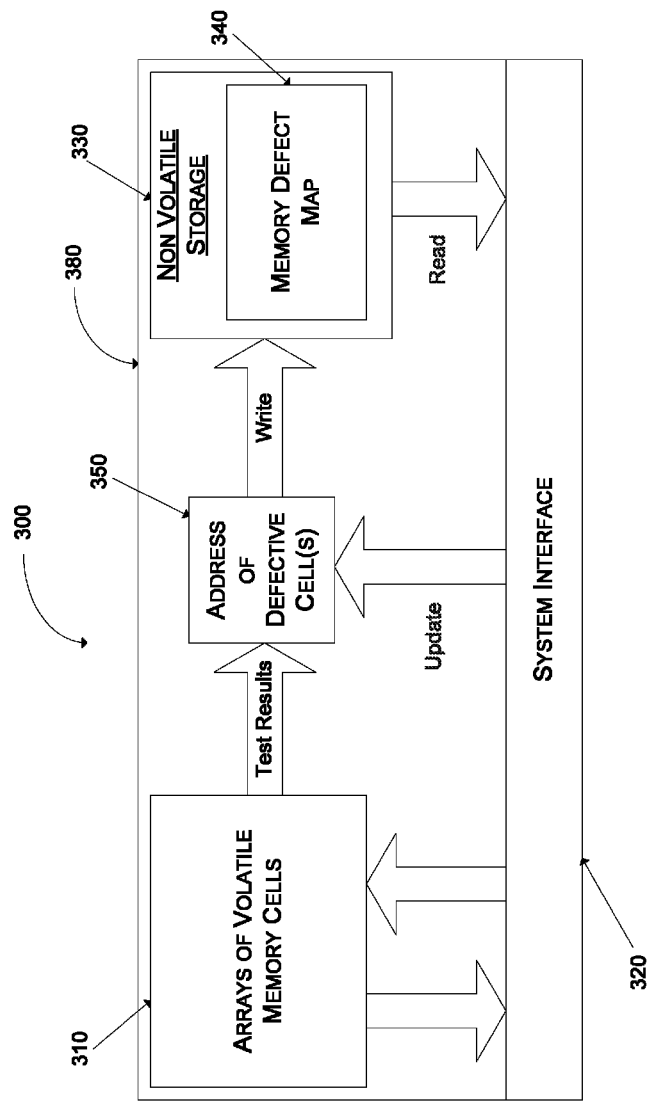
FIG. 3 shows an example DRAM component, according to aspects of the present invention.

FIG. 3 illustrates an example functional diagram of a DRAM component 300 incorporating aspects of the present disclosure. As stated above, DRAM component 300 may comprise an integrated circuit, represented by the box 380 around the elements of the DRAM component 300. As can be seen, the DRAM component 300 may include arrays of volatile memory cells 310, such as DRAM memory cells. The DRAM component 300 may also include non-volatile storage 330 within the integrated circuit 380 and communicably coupled to both the arrays of volatile memory cells 310 and a system interface 320 incorporated into the IC 380. In certain embodiments, the non-volatile storage 330 may include a mode register from a synchronous DRAM (SDRAM) component. The arrays of volatile memory cells 310 may also be coupled to the system interface 320. In certain embodiments, the system interface 320 may include pins which are coupled to the PCB of a DIMM.

The arrays of volatile memory cells 310 may be subjected to a series of tests to identify defective volatile memory cells within the arrays. As can be seen, the test results may generate the physical address of each defective volatile memory cell within the arrays of volatile memory cells 310. According to aspects of the present invention, a reference to each defective volatile memory cell, such as a physical address of the defective volatile memory cell, may be written to and stored in a memory defect map 340 within the non-volatile storage device 330. The memory defect map 340 may include a list of references to each defective volatile memory cell within the arrays of volatile memory cells 310. In certain embodiments, subsequent tests can be run that capture the addresses of each volatile memory cell that has failed since the previous test was run. These addresses may be received through the system interface 320, depending on when the test is run, and may also be written to the memory defect map 340. Notably, the memory defect map 340 may be read from non-volatile storage 330 through the system interface, as will be described below.

Figure 5:
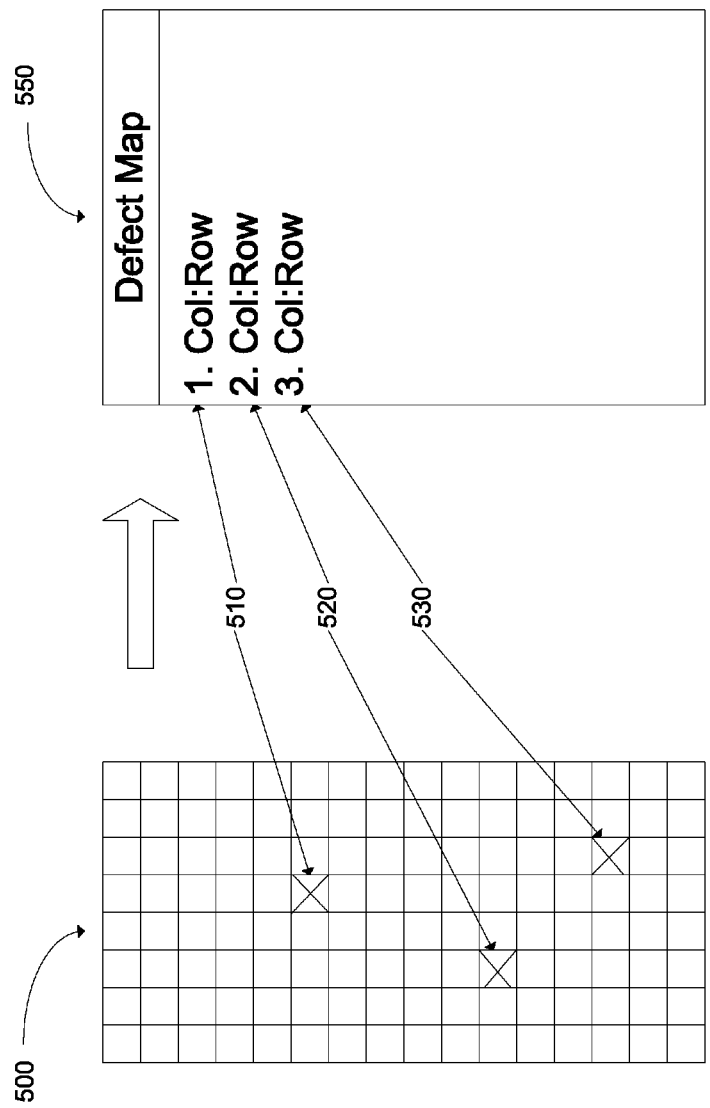
FIG. 5 shows an array of volatile memory cells and a memory defect map, according to aspects of the present disclosure.

FIG. 5 illustrates an example array of volatile memory elements 500 and an example memory defect map 550. As can be seen, the array of volatile memory elements 500 may include at least one defective volatile memory cell. In FIG. 5 the array of volatile memory elements 500 includes three defective volatile memory cells 510, 520 and 530. As can be seen reference to each of the defective volatile memory cells 510, 520 and 530 may be stored in a memory defect map 550. In the memory defect map 550, the reference includes the physical address of each of the defective volatile memory cells 510, 520 and 530 within the array of volatile memory elements 500. As can be seen, the physical address may include, for example, a column and row designation for each of the defective cells. Other reference types and configuration are possible, as would be appreciated by one of ordinary skill in view of this disclosure.

Storing a reference to each defective volatile memory cell into non-volatile memory located within a DRAM components is advantageous because the reference may be generated and stored during testing performed at each stage of the manufacturing process. These tests may include, for example, wafer tests, device tests, and module tests. DRAM components may be manufactured using semi-conductor wafers, with each wafer containing millions of volatile memory cells—including but not limited to DRAM capacitor/transistor pairs. The wafers may also be manufactured to include non-volatile memory elements, which can comprise non-volatile storage, such as non-volatile storage device 330. The wafer may then be cut into multiple dies, with each die representing a different DRAM component. Wafer tests may include tests to identify defective volatile memory cells on the wafer, on the individual dies, or at any time before the die is packaged. Device tests may include tests to identify defective volatile memory cells within the DRAM component once the DRAM component is packaged but before the DRAM component is incorporated into a DRAM memory module, such as a DIMM. Module tests may include tests to identify defective volatile memory cells within each DRAM component incorporated into the DRAM memory module.

In each of the wafer, device, and module tests, automatic test equipment (ATE) may be used to identify defective volatile memory cells, as would be appreciated by one of ordinary skill in the art in view of this disclosure. Advantageously, because the non-volatile storage is located on die, the references to the defective volatile memory cells may be stored and accumulated throughout the manufacturing process. As will be discussed below, these defective volatile memory cells may be adjusted for by information handling systems incorporating the DRAM storage, reducing or eliminating the need for redundant volatile memory cells within the DRAM components. Additionally, as will be discussed below, the list of defective volatile memory cells may be updated once the DRAM memory module is incorporated within an information handling system, such as during a power-on self test (POST) of the information handling system.

Figure 4:
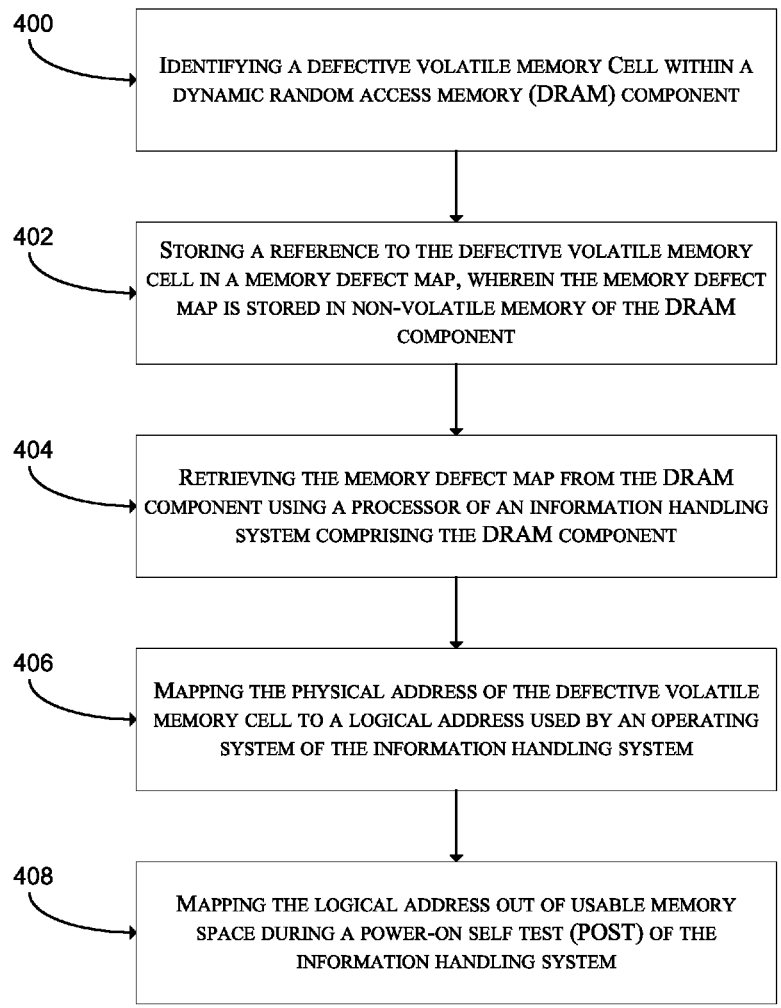
FIG. 4 shows an example method incorporating aspects of the present disclosure.

FIG. 4 illustrates an example method for identifying usable memory, according to aspects of the present disclosure. At step 400, the method includes identifying a defective volatile memory cell within a DRAM component. As described above, the DRAM component may comprise an IC comprising millions of DRAM memory cells. At step 402, the method includes storing a reference to the defective volatile memory cell in a memory defect map. The memory defect map may include a reference to each defective volatile memory cell within the DRAM component. The memory defect map may be stored in non-volatile memory of the DRAM component. The non-volatile memory may be included, for example, in the DRAM IC. The steps of identifying the defective volatile memory cell and storing a reference to the defective volatile memory cell may be completed during at least one of a wafer test, a device test, and a module test, as described above. Each of the wafer test, the device test, and the module test may be accomplished using automatic test equipment.

Step 404 include retrieving the memory defect map from the DRAM component using a processor of an information handling system coupled to the DRAM component. The information handling system may include an information handling system similar to the information handling system 100 shown in FIG. 1. In certain embodiments, the DRAM component may be incorporated into a DRAM memory module, such as DIMM 200 shown in FIG. 2, and the DRAM component may be coupled to the information handling system through an interface on the RAM memory module. In certain embodiments, a memory defect map may be retrieved from each DRAM component incorporated into the DRAM memory module and stored to a memory controller of the information handling system, such as memory controller 102*b* shown in FIG. 1.

After the memory defect map is retrieved, the defective volatile memory cell may be mapped out of usable memory. For example, in step 406 a physical address of the defective volatile memory cell may be mapped to a logical address used by an operating system of an information handling system. The physical address may be included within the reference to the defective volatile memory cell in the memory defect map, and the physical address may identify the physical location of the defective volatile memory cell within the array of volatile memory cells in the DRAM component. An operating system may address memory using a logical address, which typically includes an address generated by the BIOS of the information handling system, by which the operating system of the information handling system would address the defective volatile memory cell.

Step 408 may include mapping the logical address out of usable memory space during a POST of the information handling system. By identifying to the information handling system the defective volatile memory cells, the information handling system may adjust for the defective cells, preventing the operating system from attempting to store data to a defective cell. As would be appreciated by one of ordinary skill in view of this disclosure, by adjusting for the defective volatile memory cells at the system level, the number of redundant cells within the DRAM component can be reduced or eliminated in some instances. In certain embodiments, system level memory tests may be performed, for example, during POST, which may identify additional defective volatile memory cells or ranges within the DRAM component. The memory defect map stored within the information handling system may be updated to reflect the additional defective volatile memory cells, and the memory defect map stored in non-volatile memory of the DRAM component may be updated by the information handling system during POST to include the additional defective volatile memory cells.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Although the present disclosure has been described in detail, it should be understood that various changes, substitutions, and alterations can be made hereto without departing from the spirit and the scope of the invention as defined by the appended claims. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A dynamic random access memory (DRAM) component, comprising:
   an integrated circuit;
   an array of volatile memory cells disposed within the integrated circuit, wherein each of the volatile memory cells of the array of volatile memory cells comprises a separate capacitor-transistor pair, and wherein a first volatile memory cell of the array of volatile memory elements is defective;
   non-volatile memory disposed within the integrated circuit, wherein the non-volatile memory contains a reference to the first volatile memory cell;

a test, wherein the reference is generated and stored when the test is performed at each stage of manufacturing of the DRAM component; and a system interface, wherein the non-volatile memory is communicatively coupled to the system interface and the array of volatile memory cells.

2. The DRAM component of claim 1, wherein the reference to the first volatile memory cell is included in a memory defect map stored in the non-volatile memory.

3. The DRAM component of claim 2, wherein the memory defect map includes references to each defective volatile memory cell of the array of volatile memory cells.

4. The DRAM component of claim 2, wherein the reference to the first volatile memory cell is stored to the non-volatile memory during at least one of a wafer test, a device test, or a module test using automatic test equipment (ATE), wherein the device test is performed once the DRAM component is packaged but before the DRAM component is incorporated into a DRAM memory module.

5. The DRAM component of claim 2, wherein the memory defect map is operable to be updated, at least in part, during a system test within an information handling system comprising the DRAM component.

6. The DRAM component of claim 5, wherein the system test comprises a power-on self test (POST).

7. The DRAM component of claim 6, wherein the DRAM component is operable to transmit the memory defect map to the information handling system.

8. The DRAM component of claim 1, wherein the DRAM component comprises synchronous DRAM (SDRAM), and wherein the non-volatile memory comprises a mode register of the SDRAM component.

9. A method for identifying usable memory, comprising:
identifying a defective volatile memory cell from an array of volatile memory cells within a dynamic random access memory (DRAM) component, wherein each of the volatile memory cells of the array of volatile memory cells comprises a separate capacitor-transistor pair, and wherein the DRAM component comprises an integrated circuit;
testing the DRAM component at each stage of manufacturing, wherein a reference is generated when the test is performed at each stage of manufacturing of the DRAM component;
storing the reference to the defective volatile memory cell in a memory defect map, wherein the memory defect map is stored in non-volatile memory of the DRAM component, and wherein the non-volatile memory is disposed within the integrated circuit;
communicatively coupling the non-volatile memory to a system interface and the array of volatile memory cells;
retrieving the memory defect map from the DRAM component using a processor of an information handling system coupled to the DRAM component; and
mapping the defective volatile memory cell out of usable memory space.

10. The method of claim 9, wherein the method further comprises storing the memory defect map on a memory controller of the information handling system.

11. The method of claim 10, wherein the step of mapping the defective volatile memory element out of usable memory space comprises:
mapping the physical address of the defective volatile memory cell to a logical address used by an operating system of the information handling system, and
mapping the logical address out of usable memory space during a power-on self test (POST) of the information handling system.

12. The method of claim 11, further comprising updating the memory defect map during POST.

13. The method of claim 12, further comprising storing the updated memory defect map to the non-volatile memory.

14. The method of claim 9, wherein the DRAM component comprises synchronous DRAM (SDRAM), and wherein the non-volatile memory comprises a mode register of the SDRAM.

15. A method of claim 9, wherein the steps of identifying and storing occur during at least one of a wafer test, a device test, or a module test using automatic test equipment (ATE), wherein the device test is performed once the DRAM component is packaged but before the DRAM component is incorporated into a DRAM memory module.

16. The method of claim 9, wherein the DRAM component in included in a dual in-line memory module (DIMM) coupled to the processor.

17. An information handling system, comprising:
a processor;
memory coupled to the processor, wherein the memory comprises a dynamic random access memory (DRAM) component,
wherein the DRAM component comprises:
an integrated circuit;
an array of volatile memory cells disposed within the integrated circuit, wherein each of the volatile memory cells of the array of volatile memory cells comprises a separate capacitor-transistor pair, and wherein a first volatile memory cell of the array of volatile memory cells is defective; and
non-volatile memory disposed within the integrated circuit, wherein the non-volatile memory includes a memory defect map that contains a reference to the first volatile memory cell;
a test, wherein the reference is generated and stored when the test is performed at each stage of manufacturing of the DRAM component; and
a system interface, wherein the non-volatile memory is communicatively coupled to the system interface and the array of volatile memory cells.

18. The information handling system of claim 17, wherein the reference to the first volatile memory cell is stored to the non-volatile memory during at least one of a wafer test, a device test, or a module test using automatic test equipment (ATE), wherein the device test is performed once the DRAM component is packaged but before the DRAM component is incorporated into a DRAM memory module.

19. The information handling system of claim 18, wherein the information handling system is operable to:
retrieve the memory defect map from the DRAM component, and
map the first volatile memory cell out of usable memory space.

20. The information handling system of claim 19, wherein mapping the first volatile memory cell out of usable memory space, includes:
mapping the physical address of the first volatile memory cell to a logical address used by an operating system of the information handling system, and
mapping the logical address out of usable memory space during a power-on self test (POST) of the information handling system.

* * * * *